(12) United States Patent
Simopoulos et al.

(10) Patent No.: US 7,800,344 B2
(45) Date of Patent: Sep. 21, 2010

(54) METHOD OF DETERMINING THE ENERGY CAPACITY OF A BATTERY

(75) Inventors: Gregory N. Simopoulos, Fishers, IN (US); Gerald T. Fattic, Fishers, IN (US); John V. Caputo, Canfield, OH (US)

(73) Assignee: Delphi Technologies, Inc., Troy, MI (US)

( * ) Notice: Subject to any disclaimer, the term of this patent is extended or adjusted under 35 U.S.C. 154(b) by 760 days.

(21) Appl. No.: 11/708,500

(22) Filed: Feb. 20, 2007

(65) Prior Publication Data

US 2008/0197807 A1 Aug. 21, 2008

(51) Int. Cl.
*H02J 7/00* (2006.01)
(52) U.S. Cl. ...................... 320/132; 320/136
(58) Field of Classification Search .................. 320/132, 320/136; 324/429, 433
See application file for complete search history.

(56) References Cited

U.S. PATENT DOCUMENTS

| 5,049,803 | A | * | 9/1991 | Palanisamy ................. 320/132 |
| 5,578,915 | A | | 11/1996 | Crouch, Jr. et al. |
| 6,586,130 | B1 | | 7/2003 | Guiheen et al. |
| 6,618,681 | B2 | | 9/2003 | Hoenig et al. |
| 6,774,636 | B2 | | 8/2004 | Guiheen et al. |
| 6,885,167 | B2 | | 4/2005 | Palanisamy et al. |
| 7,058,451 | B2 | | 6/2006 | Obel et al. |
| 7,109,685 | B2 | | 9/2006 | Tate, Jr. et al. |
| 7,466,138 | B2 | * | 12/2008 | Cho et al. .................... 324/426 |

* cited by examiner

*Primary Examiner*—Edward Tso
*Assistant Examiner*—Richard V Muralidar
(74) *Attorney, Agent, or Firm*—Thomas N. Twomey

(57) ABSTRACT

A method of determining the available energy of a battery provides for measuring first and second open circuit voltage of the battery with a change of energy level occurring therebetween. The two open circuit voltages are correlated to a state of charge level and the measured amount of change of energy is divided by the change of the state of charge.

15 Claims, 1 Drawing Sheet

US 7,800,344 B2

METHOD OF DETERMINING THE ENERGY CAPACITY OF A BATTERY

TECHNICAL FIELD

The field of this invention relates to a method of determining the energy capacity of an electrochemical battery.

BACKGROUND OF THE DISCLOSURE

Electrochemical batteries are widely used and are important particularly with rechargeable type batteries for use in a wide variety of apparatus ranging from laptop computers to automotive vehicles particularly with hybrid and all electric vehicles.

It is known that batteries degrade overtime. A rechargeable battery loses its capacity i.e. the total amount of energy available lessens over time regardless of its state of charge. Is it thus desirable to know not only the state of charge of a battery i.e. its level of stored energy which consolidates to the open circuit voltage (OCV) but also the capacity for storing energy. Often the capacity of the battery compared to its rated capacity when new is referred to as its state of health. When the capacity becomes too small it may not support auxiliary loads and possibly cranking events for automotive applications and the battery is said to have reached the end of its useful life.

A method for determining battery capacity is known where the current is a ramped until the voltage is observed to rise rapidly. The peak in voltage relates to the present state of charge or available energy of the battery. The ramping of current requires control of the charging current which is usually lacking in conventional automotive vehicles.

Another known method for determining battery capacity requires the battery to discharge to a low state of charge. A time amp hour integration is used to track the energy input during a charging cycle. However deep discharge cycling is not practiced in most hybrid or conventional vehicles due to battery damage at low states of charge and loss of battery related functions.

What is needed is a method that provides a determination of battery capacity without the need for controlled current or deep discharge of batteries.

SUMMARY OF THE DISCLOSURE

In accordance with one aspect of the invention, a method of determining the available energy of a battery includes the steps of measuring a first open circuit voltage of the battery to correlate to and determine a first state of charge, changing the level of energy available in the battery by a measured amount, then measuring a second open circuit voltage (OCV) of the battery to determine a second state of charge, and dividing the measured amount of energy change in the battery by the calculated change in the state of charge from the first state of charge to the second state of charge to determine the available energy capacity of the battery.

Preferably, the method further includes the steps of resting the battery before each of the measuring the steps for the first open circuit voltage and the second open circuit voltage to obtain a diffusion equilibrium state in the battery.

Preferably the step of changing the level of energy is a discharge event exerted on the battery. In another embodiment, the changing the level of energy step includes charging the battery with an over voltage down to a predetermining low current. The predetermined low current can be substantially at or below 3 amps. Alternately, the overcharge voltage is set at a level lower than a gassing threshold for the battery. The predetermining low current is substantially at or below three (3) amps. In one embodiment, the predetermined low current is at substantially zero amps. In another embodiment, the changing of the level of energy includes a discharge event at approximately a constant current.

BRIEF DESCRIPTION OF THE DRAWINGS

Reference now is made to the accompanying drawings in which.

DETAILED DESCRIPTION OF THE PREFERRED EMBODIMENT

One can take a battery such as a lithium battery and let it rest to reach an equilibrium state. The rest period is governed by Fick's law where $$Q = D \cdot \Delta C(a/l)$$

where,
Q=quantity of reactant diffusing per unit time.
D=diffusion coefficient.
$\Delta C$=difference in concentration of reactant within the separator pore and outside the pore.
a=aggregate cross section of the pores
l=distance over which the reactant must diffuse.

The diffusion coefficient determined by the following equation:

$$D = D_0 e^{-(E_A/RT)}$$

where,
$D_0$=maximum diffusion coefficient.
$E_A$=activation energy for diffusion.
R=gas constant.
T=temperature.

As such at room temperature, 20 or more hours of rest is often required before the open circuit voltage (OCV) becomes constant to within 1 part in 20,000.

The open circuit voltage is then measured. The Nernst equation is $$E = E^0 - \frac{RT}{nF} \ln\left(\frac{a_C^c a_D^d}{a_A^a a_B^b}\right)$$

where,
$E^0$=standard equilibrium voltage where reactant concentration is 1 molar.
R=ideal gas constant 8.314 J/mole $-°$ K.
a=species activities (effective concentration).
n=number of electrons taking part in the reaction.
F=Faraday constant 96,487 coulombs.

The OCV level is a function of the effective concentration of the reactants. For a lead acid battery, the OCV is directly correlated with the acid concentration. For example, in a high complete state of charge (SOC), the acid level is at 100% concentration and the voltage level for each cell in a typical level acid battery will be 2.4 V. On the other end, a fully discharged cell will have all the acid converted to water. In other words the acid concentration goes down to 0% and is converted to $H_2O$ which provides no support for conductivity. The voltage level (OCV) in this fully discharge condition drops to 1.75 V for each cell. For states of change between the 0-100%, intermediate voltages are read. There are standard tables available which provide the OCV level with the percentage of the SOC. The SOC may also be presented as a fraction between 0 and 1 instead of a percentage between 0% and 100%.

One can then see that the open circuit voltage level has a correlation with the state of charge. One can then cycle and exercise the battery and determine the change of the state of charge and then project or extrapolate the total charge capacity.

Figure 1:
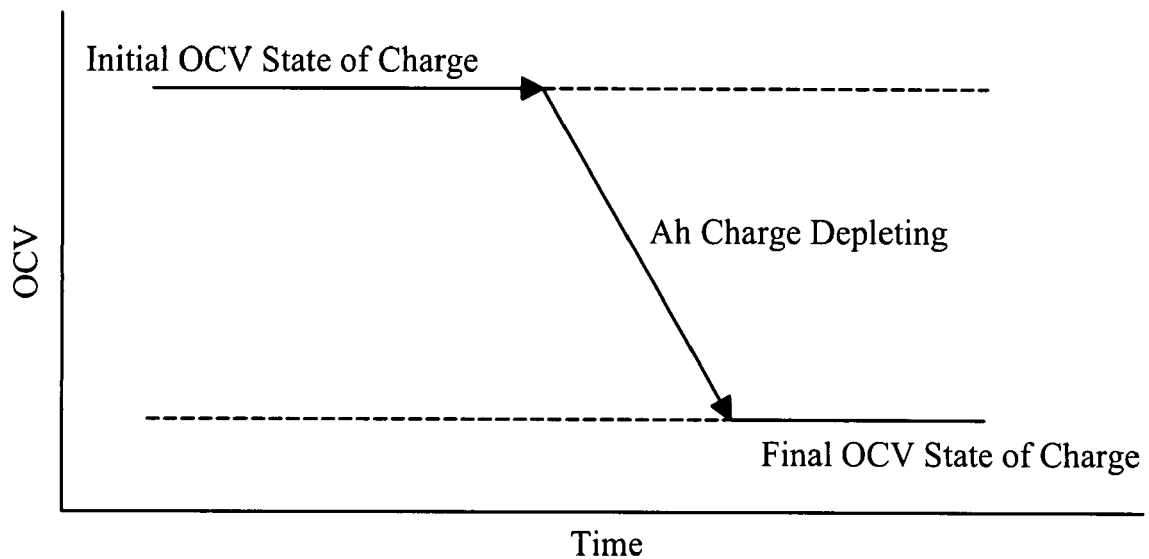
FIG. 1 is a schematic chart showing initial OCV level with a discharging event and a final OCV level.

Referring now to FIG. 1, after equilibrium is achieved, an initial wake up reading of the open circuit voltage is read. The battery then undergoes a charge depleting event where the ampere hours (Ah) are tracked. The battery is then again allowed to rest until it reaches a second equilibrium state. After the second equilibrium state is achieved, a second OCV wake up reading is then made. The change in voltages is then correlated with the change of the state of charge which is found in the available and known look up tables. The two voltage readings correlated into two states of charge readings. The difference in the initial and final state of charge is then determined i.e. the change of the state of charge again most commonly set as the fractional difference between the initial and final SOC.

One can then determine the battery capacity by dividing the tracked discharge in ampere hours by the change of the state of charge as shown in the following equation:

$$AhCapacity = \frac{\Delta Ah}{\Delta SOC}$$

Figure 2:
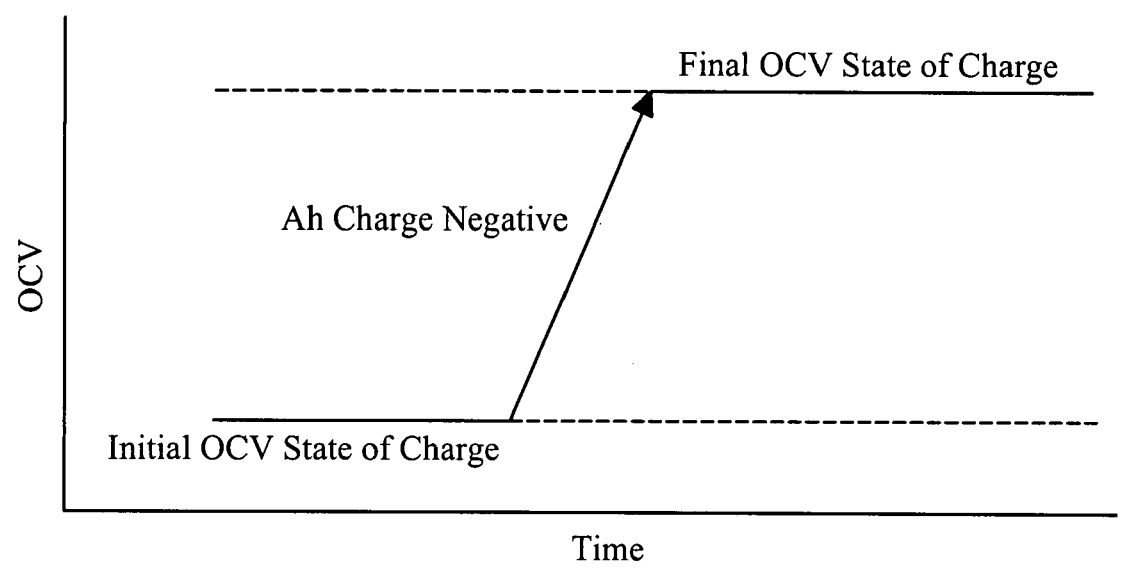
FIG. 2 is a schematic showing an initial OCV level and a charging event with a final OCV level.

The discharge event can be replaced by a charging event in which the graph will look more like that shown in FIG. 2 when the final OCV is higher than the initial OCV. The change of ampere hours used is negative and the change of the state of charge is also negative which will then give the same positive value for the battery capacity.

This method has been tested on a VRLA-BCI Group 31 AGM battery in which the battery was charged to a high state of charge i.e. 100% and allowed to stand for 72. The battery was then discharged 11.6 Ah and allowed to stand for another 72 hours. The OCV measurement was taken indicating the battery was at 81.35% state of charge for a difference of 18.65%.

The calculated capacity thus is as follows:

$$AhCapacity = 100\% \cdot \frac{11.6\ Ah}{18.65\%} = 62.2\ Ah$$

The calculated prediction was then compared to the capacity of the total discharge. The battery was then discharged at 25 Amps to 10.5 volt level and allowed to stand for 15 minutes. The 25 Amp discharge raised the total discharge level to 62.3 Ah. Another discharge at 3 Amps to 10.5 volts was then conducted which raised the total Ampere hours discharged to 69.9 Ah. This total actual capacity value is within 12.4% of the calculated predictive value.

In another variation to determine the SOC capacity, it is known that in for example, a lead acid battery the chemical reaction goes between the left side and right side of the equation as follows.

$$PbO_2 + Pb + 2H_2SO_4 \Leftrightarrow 2PbSO_4 + 2H_2SO_4 + 2H_2O$$

The thermodynamically stable state of all batteries is the discharged state. Work must be done to push the chemical equilibrium to the left side of the above shown equation. Charging the battery thus requires a minimum amount of over-voltage to push the chemical equilibrium to the left. The higher the energy above a certain activation potential, the more the reactants are converted to active material, such as $PbO_2$, $Pb$ and $H_2SO_4$ for example in a lead acid battery.

The higher the applied voltage, the more charged the battery becomes up to a limit. For example, batteries charged by 13.8 volts where the final current approaches 0 Amps is not as charged as one charged by 14.2 volts where the current also equally approaches 0 Amps. The limit is at a temperature dependent voltage (about 15 V @ RT) where the process can no longer be pushed to the left and when the battery is at 100% state of charge. Additional voltage only serves to decompose the reacting materials and gassing occurs.

One can then take a partially discharged battery that has been standing for a sufficient period where the battery reaches an equilibrium, the first initial OCV/SOC level is determined as shown in FIG. 2. We know that the peak current during the charge cycle correlates to the state of charge. For example, a battery in a low level charge state will accept more charging current while the identical battery in a high level charge state will accept less charging current. The battery is then charged and the amp hours recorded until the current drops to a level where the charging has essentially ceased; for example, a charge at 14.2 volts till the current level goes below 3 Amps. One can go down below 3 Amps but the charging process becomes inefficient and furthermore the charging voltage needs to below the gassing threshold.

Once the effective 100% SOC level has been obtained, the OCV level at the fully charge level is taken and the equation $$AhCapacity = \frac{\Delta Ah}{\Delta SOC}$$

is then calculated using the change of the SOC from the initial reading to the fully charged level.

A third variation using a change of state of charge and amount of Ampere hour discharge will now be described with reference to FIG. 2. One measures the voltage base state of charge at the first step. One then uses a discharge event that approximates a constant current where the amp hours removed is recorded. The final open charge voltage is measured and the correlated final state of charge percentage is correlated. Using the formula;

$$AhCapacity = \frac{\Delta Ah}{\Delta SOC}$$

the capacity is then determined.

In running this constant current discharge event, five batteries of the flooded group 34 PbA type were tested and the percent error from the measured capacity from the calculated capacity determined by this method were as follows:

| Battery | Measured Capacity | Calculated Capacity | Percent Error |
|---|---|---|---|
| 1 | 47 | 47.92 | 1.5 |
| 2 | 33 | 32.73 | 0.84 |
| 3 | 44 | 48.87 | 10 |
| 4 | 35 | 38.19 | 8.4 |
| 5 | 23.5 | 25.26 | 7 |

It is foreseen that the three above alternative methodologies may be combined to provide a composite value for capacity. Furthermore, it is foreseen that in determining the composite value, the values obtained by the three methodologies may be weighted differently depending upon past history or present conditions.

It will be readily understood by those persons skilled in the art that the present invention is susceptible of broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

We claim:

1. A method of determining the available energy of a battery comprising:
    measuring a first open circuit voltage of said battery to correlate to and determine a first state of charge;
    changing a level of energy available in said battery by a measured amount;
    measuring a second open circuit voltage of said battery after changing the level of energy to determine a second state of charge; and
    dividing the measured amount of energy change in said battery by the calculated change in the state of charge from the first state of charge to the second state of charge to determine the available energy capacity of said battery;
    wherein the step of changing the level of energy includes a discharge event, and the discharge event occurs at a current having a generally unvarying rate.

2. The method as defined in claim 1, further including the step of:
    resting said battery for a duration of time before each step of measuring said first open circuit voltage and said second open circuit voltage to obtain a diffusion equilibrium state in said battery.

3. The method as defined in claim 2, wherein the step of resting the battery further includes the duration of time comprising a first duration of time to rest the battery before conducting the step of measuring the first open circuit voltage and a second duration of time to rest the battery before conducting the second open circuit voltage, said first duration of time being about the same as said second duration of time.

4. The method as defined in claim 2, further including the step of:
    charging the battery, wherein the step of charging the battery occurs before the step of resting the battery, and the step of resting the battery occurs before the step of measuring said first open circuit voltage of the battery.

5. The method as defined in claim 4, wherein the step of charging the battery further includes the battery being charged to a 100% state of charge.

6. The method as defined in claim 1, wherein the duration of time is greater than 4 hours.

7. A method of determining the available energy of a battery comprising:
    measuring a first open circuit voltage of said battery to correlate to and determine a first state of charge;
    changing a level of energy available in said battery by a measured amount;
    measuring a second open circuit voltage of said battery after changing the level of energy to determine a second state of charge; and
    dividing the measured amount of energy change in said battery by the calculated change in the state of charge from the first state of charge to the second state of charge to determine the available energy capacity of said battery
    wherein the step of changing the level of energy comprises a charging event, and the charging event uses an overvoltage to charge the battery until a battery charge current attains a predetermined low current value being at a generally unvarying rate, said predetermined low current value being one of:
        (i) substantially three amps, and
        (ii) greater than zero amps and less than three amps.

8. The method as defined in claim 7, wherein said overvoltage is less than a gassing threshold of the battery.

9. A method of calculating a composite value for the available energy of a battery, comprising:
    determining a first value for the available energy of the battery using a first methodology;
    determining a second value for the available energy of the battery using a second methodology different from the first methodology;
    determining a third value for the available energy of the battery using a third methodology different from the first methodology and the second methodology; and
    calculating the composite value;
    wherein the composite value is in mathematical relation to the first and the second and the third value, and the first and the second and the third methodology each include:
        measuring a first open circuit voltage of said battery to correlate to and determine a first state of charge;
        changing a level of energy available in said battery by a measured amount;
        measuring a second open circuit voltage of said battery after changing the level of energy to determine a second state of charge;
        dividing the measured amount of energy change in said battery by the calculated change in the state of charge from the first state of charge to the second state of charge to determine the available energy capacity of said battery.

10. The method as defined in claim 9, wherein the first and the second and the third methodology further include:
    resting said battery for a duration of time before each step of measuring said first open circuit voltage and said second open circuit voltage to obtain a diffusion equilibrium state in said battery.

11. The method as defined in claim 9, wherein the composite value comprises a weighted combination value with at least one of the first and the second and the third value being weighted based on a past history condition of the battery.

12. The method as defined in claim 9, wherein the step of changing the level of energy in the first methodology comprises at least one of:
    (i) a discharging event, and
    (ii) a charging event.

13. The method as defined in claim 9, wherein the step of changing the level of energy in the second methodology comprises a charging event, and the charging event uses an overvoltage to charge the battery until a battery charge current attains a predetermined low current value being at a generally unvarying rate, said predetermined low current value being one of:

(i) being substantially three amps, and
(ii) being greater than zero amps and less than three amps.

14. The method as defined in claim 13, wherein the overvoltage is less than a gassing threshold of the battery.

15. The method as defined in claim 9, wherein the step of changing the level of energy in the third methodology comprises a discharge event, and the discharge event occurs at a current having a generally unvarying rate.

* * * * *